(12) United States Patent
Sakurai et al.

(10) Patent No.: US 10,882,082 B2
(45) Date of Patent: Jan. 5, 2021

(54) FREEZE CLEANING APPARATUS

(71) Applicant: TOSHIBA MEMORY CORPORATION, Tokyo (JP)

(72) Inventors: Hideaki Sakurai, Kanagawa (JP); Kyo Otsubo, Tokyo (JP); Minako Inukai, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/773,679

(22) Filed: Jan. 27, 2020

(65) Prior Publication Data
US 2020/0156121 A1 May 21, 2020

Related U.S. Application Data

(62) Division of application No. 15/691,441, filed on Aug. 30, 2017, now abandoned.

(30) Foreign Application Priority Data

Mar. 23, 2017 (JP) .................. 2017-058096

(51) Int. Cl.
*B08B 7/00* (2006.01)
*H01L 21/02* (2006.01)
(Continued)

(52) U.S. Cl.
CPC ...... *B08B 7/0092* (2013.01); *H01L 21/02057* (2013.01); *H01L 21/67023* (2013.01);
(Continued)

(58) Field of Classification Search
None
See application file for complete search history.

(56) References Cited

U.S. PATENT DOCUMENTS 5,748,435 A * 5/1998 Parkhe .................... G03F 7/707
361/234
5,817,178 A 10/1998 Mita et al.
(Continued)

FOREIGN PATENT DOCUMENTS

JP 3996499 B2 10/2007
JP 2012064760 A 3/2012
(Continued)

OTHER PUBLICATIONS

Japanese Office Action, dated Dec. 2, 2019, mailed in counterpart Japanese Application No. 2017-058096, 10 pages (with translation).

*Primary Examiner* — Nicole Blan
(74) *Attorney, Agent, or Firm* — Kim & Stewart LLP

(57) ABSTRACT

A freeze cleaning apparatus includes a table for supporting a processing target substrate having a first surface and a second surface opposite to the first surface, a liquid supply unit positioned to supply a cleaning liquid onto the second surface of the processing target substrate that is placed such that the first surface faces the table, and a cooling gas discharge unit in the table to supply a cooling gas to the first surface side of the processing target substrate. A gap between the table and the processing target substrate is set such that the cooling gas flows as a laminar flow between the table and the processing target substrate.

4 Claims, 7 Drawing Sheets

(51) Int. Cl.
*H01L 21/67* (2006.01)
*H01L 21/687* (2006.01)

(52) U.S. Cl.
CPC .. *H01L 21/67028* (2013.01); *H01L 21/67051* (2013.01); *H01L 21/67109* (2013.01); *H01L 21/68735* (2013.01)

(56) References Cited

U.S. PATENT DOCUMENTS

| | | |
|---|---|---|
| 2009/0032188 A1 | 2/2009 | Tsuchiya et al. |
| 2010/0313915 A1 | 12/2010 | Fujiwara et al. |
| 2013/0167877 A1 | 7/2013 | Fujiwara et al. |
| 2014/0235070 A1 | 8/2014 | Bassett et al. |
| 2018/0047559 A1* | 2/2018 | Kamiya ............ H01L 21/67051 |

FOREIGN PATENT DOCUMENTS

| | | |
|---|---|---|
| JP | 2012212758 A | 11/2012 |
| JP | 2014022664 A | 2/2014 |
| JP | 5497599 B2 | 5/2014 |
| JP | 2015185756 A | 10/2015 |
| JP | 5865073 B2 | 2/2016 |
| JP | 5930270 B2 | 6/2016 |
| KR | 20110017139 A | 2/2011 |

* cited by examiner

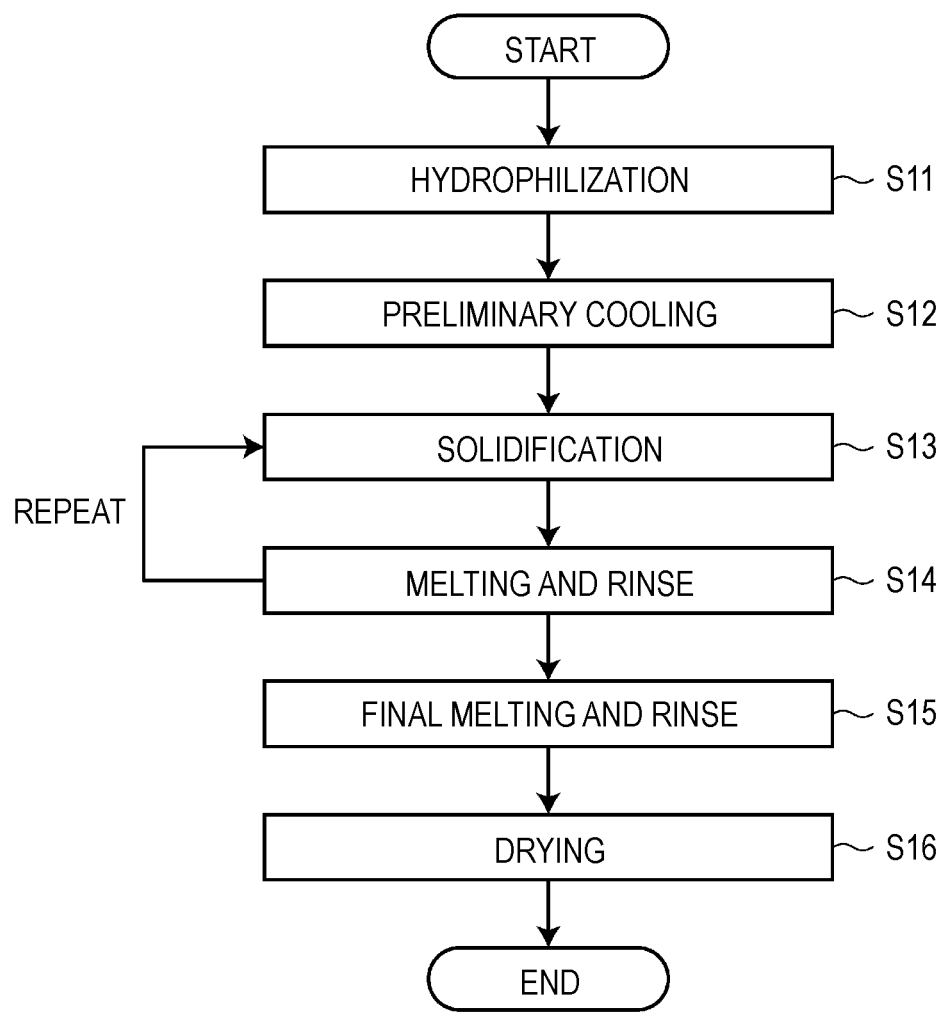

FREEZE CLEANING APPARATUS

CROSS-REFERENCE TO RELATED APPLICATIONS

This application is a division of U.S. patent application Ser. No. 15/691,441, filed on Aug. 30, 2017, which is based upon and claims the benefit of priority from Japanese Patent Application No. 2017-058096, filed Mar. 23, 2017, the entire contents of each of which are incorporated herein by reference.

FIELD

Embodiments described herein relate generally to a freeze cleaning apparatus.

BACKGROUND

In manufacturing semiconductors, flat panel displays, solar panels, and the like, a process of forming fine patterns on a substrate is repeatedly performed, and the surface of the substrate is cleaned for each process. For example, foreign materials attached to the substrate surface are removed using a cleaning method such as two-fluid jet cleaning or ultrasonic cleaning. With these methods, however, it is difficult to remove foreign materials having a small size. Thus, as the pattern formed on the substrate becomes finer, there is a demand for a cleaning method capable of removing foreign materials of a finer size.

DESCRIPTION OF THE DRAWINGS

FIG. 6 is a flow chart illustrating a freeze cleaning method according to a third exemplary embodiment.

DETAILED DESCRIPTION

Figure 1:
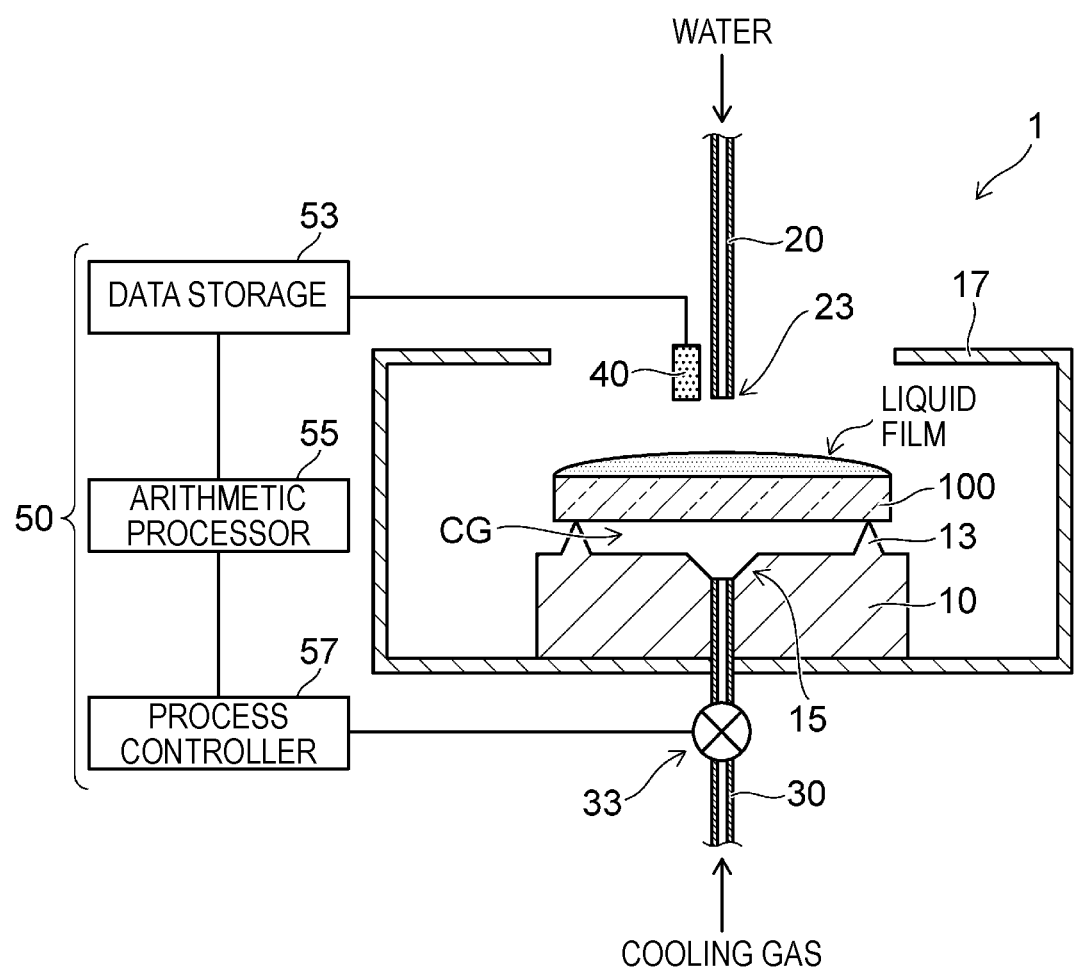
FIG. 1 is a schematic cross-sectional view illustrating a freeze cleaning apparatus according to a first exemplary embodiment.

Embodiments provide a freeze cleaning apparatus that is improved in performance for removing foreign materials of a fine size.

In general, according to one embodiment, a freeze cleaning apparatus includes a table for supporting a processing target substrate having a first surface and a second surface opposite to the first surface, a liquid supply unit positioned to supply a cleaning liquid onto the second surface of the processing target substrate that is placed such that the first surface faces the table, and a cooling gas discharge unit in the table to supply a cooling gas to the first surface side of the processing target substrate. A gap between the table and the processing target substrate is set such that the cooling gas flows as a laminar flow between the table and the processing target substrate.

Hereinafter, exemplary embodiments will be described with reference to the drawings. In the drawings, the same parts will be denoted by the same reference numerals, and a detailed description thereof will be properly omitted for brevity, and different parts will be described. The drawings are schematic or conceptual, and the relationship between the thickness and the width of each part, the ratio of the sizes of the parts, and the like are not necessarily the same as the actual ones. In addition, even in the case of representing the same part, the dimension and ratio of the part may be illustrated differently in some drawings.

First Exemplary Embodiment

FIG. 1 is a schematic cross-sectional view illustrating a freeze cleaning apparatus 1 according to a first exemplary embodiment. The freeze cleaning apparatus 1 is used in manufacturing processes including microfabrication such as semiconductor manufacturing, flat panel display manufacturing, and solar panel manufacturing, and is mainly applied to a process for removing fine particles with low damage.

The freeze cleaning apparatus 1 includes a table 10 on which a processing target substrate 100 is placed, a liquid supply unit 20 that supplies a cleaning liquid to the top surface of the processing target substrate 100, and a cooling gas supply unit 30 that cools the processing target substrate 100.

As illustrated in FIG. 1, the table 10 includes a substrate holding portion 13. The substrate holding portion 13 is, for example, a protrusion provided on the top surface of the table 10, and the processing target substrate 100 is placed on the protrusion. Thus, a cooling space CG may be provided between the table 10 and the processing target substrate 100. Further, the table 10 is provided inside a housing 17 to be rotatable in a state where the processing target substrate 100 is placed thereon.

The liquid supply unit 20 supplies a cleaning liquid for forming a liquid film on the top surface of the processing target substrate 100. The liquid supply unit 20 is, for example, a pipe that supplies deionized water as a cleaning liquid, and includes a nozzle 23 that faces the top surface of the processing target substrate 100.

The cooling gas supply unit 30 is, for example, a gas pipe that supplies nitrogen gas to the cooling space CG via the table 10. The cooling gas is discharged to the cooling space CG, for example, from a discharge port 15 provided on the top surface of the table 10. The cooling gas supply unit 30 includes, for example, a flow rate adjustment valve 33 that adjusts the gas flow rate. As the cooling gas, for example, low-temperature nitrogen ($N_2$) is used.

In the freeze cleaning apparatus 1, a cooling gas is supplied to the cooling space CG to cool the processing target substrate 100 so that the liquid film formed on the top surface of the processing target substrate 100 is solidified. Subsequently, for example, deionized water is supplied onto the solidified liquid film so as to melt and remove the liquid film from the processing target substrate 100. In this process, fine particles attached to the top surface of the processing target substrate 100 are removed.

For example, in manufacturing semiconductors, the reduction of manufacturing costs is a problem, and a pattern formation technique using nanoimprint has been developed as low-cost lithography. The nanoimprint lithography is a technique of forming a pattern in a resist by pressing a template, serving as an original plate for pattern formation, against a wafer substrate in a state where the resist is sandwiched between the template and the wafer substrate. Since the nanoimprint lithography is equal-magnification transfer from a template pattern to a wafer pattern, it can be said that the requirement for removing foreign materials, such as particles attached to the template, is very high compared with, for example, a reticle for liquid immersion exposure. Specifically, it is required to develop a cleaning and inspection technology capable of removing particles of 20 nanometers (nm) or less.

In the two-fluid nozzle system, which is a major cleaning technology used in the related art, a gas is caused to collide with a cleaning liquid to form droplets, which are then discharged toward a processing target substrate. In this cleaning method, it becomes clear that the particle removal rate decreases as the particle size decreases. For example, it is known that, at a solid-liquid interface between a processing target substrate and a liquid layer on the substrate, the liquid layer having a thickness of several tens of nanometers from the substrate surface becomes a molecular layer which is very difficult to move due to interaction with the substrate surface. Therefore, particles in this molecular layer are hardly affected by liquid flow, and it is difficult to remove the particles.

On the contrary, in the freeze cleaning apparatus 1 according to the exemplary embodiment, a liquid film is formed on the top surface of the processing target substrate 100, and the liquid film is solidified. Then, the particles attached to the substrate are peeled off and removed due to the expansion of the liquid film in this process. Accordingly, it is possible to remove fine particles on the processing target substrate.

Further, in the freeze cleaning apparatus 1, a cooling gas is supplied to the cooling space CG on the rear surface side of the processing target substrate 100 so as to cool the processing target substrate 100. Therefore, it is possible to efficiently cool, for example, a template even if the template uses a quartz base material having a thickness exceeding 6 millimeters. Thus, the cooling time may be shortened.

Figure 2A:
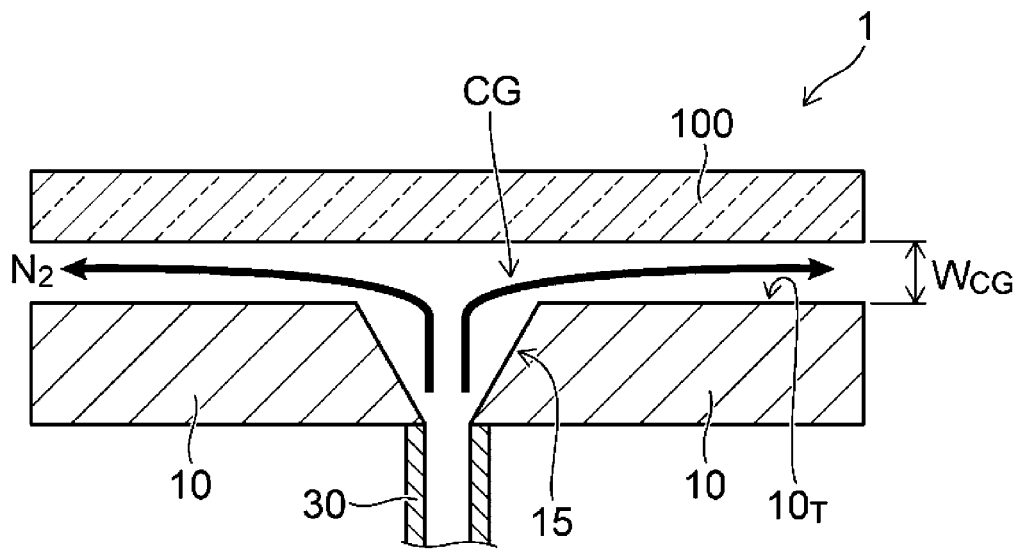
FIGS. 2A and 2B are schematic views illustrating a part of the freeze cleaning apparatus according to the first exemplary embodiment.
Figure 2B:
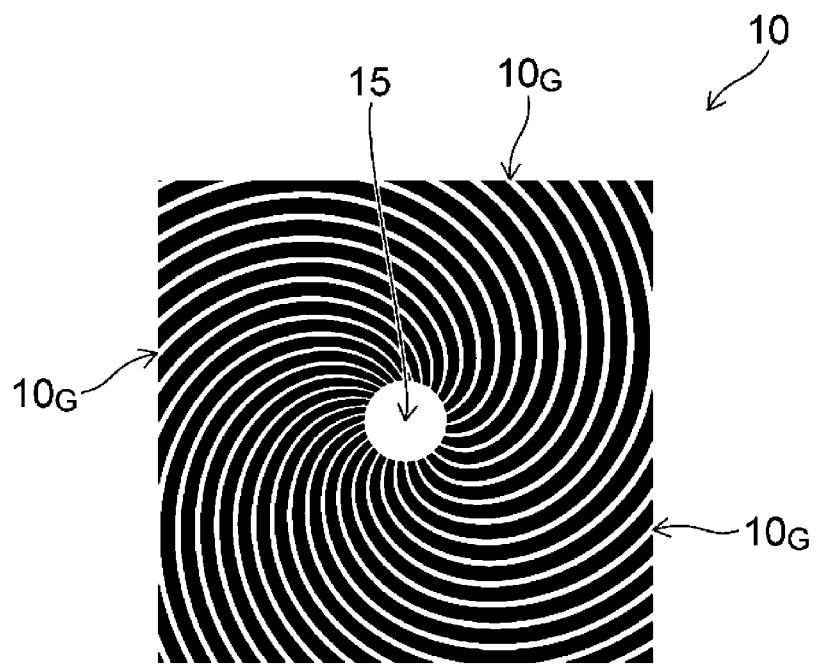

FIGS. 2A and 2B are schematic views illustrating a part of the freeze cleaning apparatus according to the first exemplary embodiment. FIG. 2A is a cross-sectional view illustrating a state of cooling the processing target substrate 100 placed on the table 10. FIG. 2B is a plan view illustrating grooves $10_G$ provided on a top surface $10_T$ of the table 10.

As illustrated in FIG. 2A, in the freeze cleaning apparatus 1, nitrogen gas cooled to, for example, −100° C. is supplied to the cooling space CG from the cooling gas supply unit 30 via the discharge port 15 of the table 10. An interval (e.g., a gap or a space) $W_{CG}$ between the processing target substrate 100 and the table 10 is set such that the cooling gas flowing from the discharge port 15 to the outer edge of the table 10 becomes a laminar flow.

For example, assuming that the distance from the discharge port 15 of the table 10 to the outer edge of the table 10 is "L," the flow velocity of the cooling gas is "v," and the kinematic viscosity of the cooling gas is "n," a Reynolds number Re is expressed by the following equation (1).

$$Re = \frac{v \times L}{n} \quad (1)$$

A 99% laminar boundary layer thickness δ (m) of the cooling gas flowing between the processing target substrate 100 and the table 10 is expressed by the following equation (2).

$$\delta = 4.92 \times L \times \sqrt{\frac{x}{L \times Re}} \quad (2)$$

Here, x is a coordinate along the flow path on the table 10.

Table 1 represents Reynolds numbers Re when the kinematic viscosity n is set to $1.492 \times 10^{-6}$ m/s, and L is set to 0.3 m and 0.15 m.

TABLE 1

| | Reynolds number (Re) | |
| --- | --- | --- |
| | Flat plate Length L | |
| Velocity v | 0.3 (m) | 0.15 (m) |
| 0.01 (m/sec) | 200 | 100 |
| 0.1 (m/sec) | 2000 | 1000 |
| 1 (m/sec) | 20000 | 10000 |

In addition, Table 2 represents the 99% laminar boundary layer thickness δ estimated using the Reynolds numbers represented in Table 1.

TABLE 2

| | 99% Laminar boundary layer thickness (δ) Unit (m) | |
| --- | --- | --- |
| | Flat plate Length L | |
| Velocity v | 0.3 (m) | 0.15 (m) |
| 0.01 (m/sec) | 0.10 | 0.074 |
| 0.1 (m/sec) | 0.033 | 0.023 |
| 1 (m/sec) | 0.010 | 0.0074 |

The minimum value of the laminar boundary layer thickness represented in Table 2 is 0.0074 m. Therefore, when the interval $W_{CG}$ between the processing target substrate 100 and the table 10 is set to, for example, 0.0074 m or less, the cooling gas may be caused to flow as a laminar flow. In addition, the interval $W_{CG}$ between the processing target substrate 100 and the table 10 is set to, for example, 4 mm or less, preferably 3 mm or less.

As illustrated in FIG. 2B, a plurality of grooves 10G may be provided on the top surface 10T of the table 10. The cooling gas flows along the grooves $10_G$ between the processing target substrate 100 and the table 10. The grooves $10_G$ are provided to extend, for example, from the discharge port 15 to the outer edge of the table 10. Further, as illustrated in FIG. 2B, the grooves $10_G$ are provided in a spiral shape such that the distance along the grooves $10_G$ from the discharge port 15 to the outer edge is longer than the linear distance from the discharge port 15 to the outer edge. As a result, the time during which the cooling gas is in contact with the rear surface of the processing target substrate 100 becomes longer. Thus, the processing target substrate 100 may be efficiently cooled. The exemplary embodiment is not limited to this, but, for example, the grooves $10_G$ may not reach the outer edge of the table 10. That is, the outer edge of the table 10 may not be grooved and instead have a flat surface.

Figure 3A:
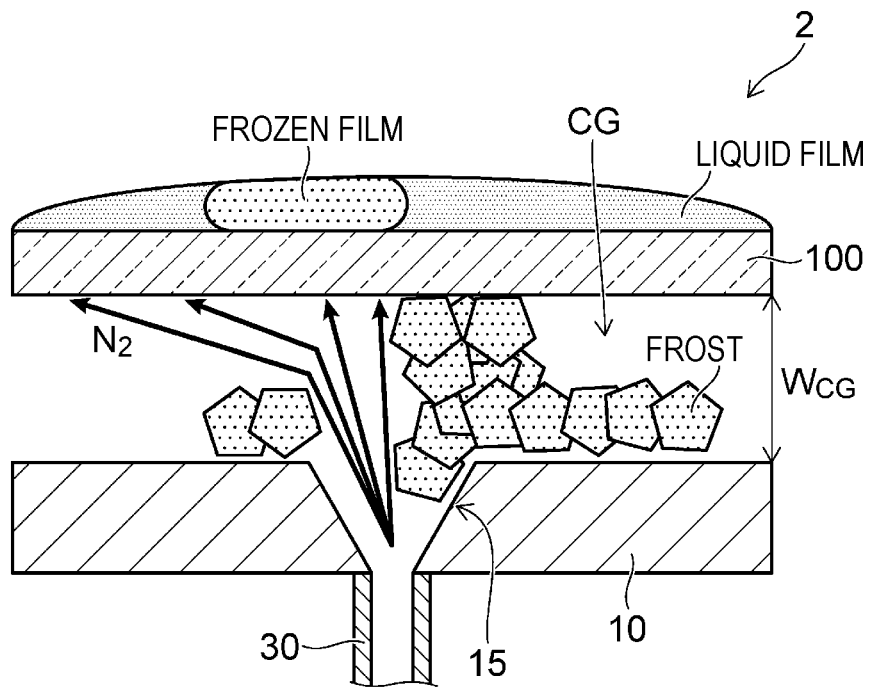
FIGS. 3A and 3B are schematic cross-sectional views illustrating a freeze cleaning apparatus according to a comparative example.
Figure 3B:
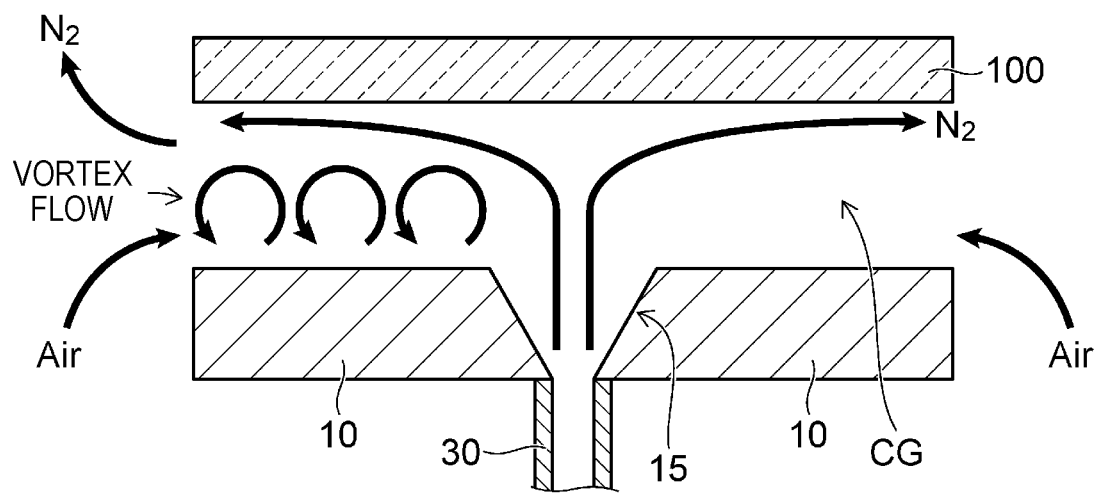

FIGS. 3A and 3B are schematic cross-sectional views illustrating a freeze cleaning apparatus 2 according to a comparative example. In this example, the interval $W_{CG}$ between the processing target substrate 100 and the table 10 is set to be wider than the 99% laminar boundary layer thickness $\delta$. Therefore, the cooling gas supplied to the cooling space CG flows as a turbulent flow between the processing target substrate 100 and the table 10.

As illustrated in FIG. 3A, frost is formed in the cooling space CG in the freeze cleaning apparatus 2. Thus, for example, the flow path of the cooling gas may be blocked. Therefore, the processing target substrate 100 is not cooled uniformly, and the liquid film formed on the top surface of the processing target substrate 100 is partially solidified. Therefore, particles are not removed in some portions on the top surface of the processing target substrate 100.

For example, when the flow of the cooling gas becomes a turbulent flow, a vortex flow occurs in the cooling space CG as illustrated in FIG. 3B, and the outside air containing moisture is taken into the cooling space CG. Therefore, for example, even when dry nitrogen is used as the cooling gas, frost is generated in the cooling space CG.

In contrast, in the exemplary embodiment, the cooling gas may be made as a laminar flow by setting the interval $W_{CG}$ between the processing target substrate 100 and the table 10 to be smaller than the 99% laminar boundary layer thickness $\delta$. Thus, it is possible to suppress the intake of outside air and to prevent the occurrence of frost in the cooling space CG. As a result, the processing target substrate 100 may be uniformly cooled.

Second Exemplary Embodiment

Figure 4:
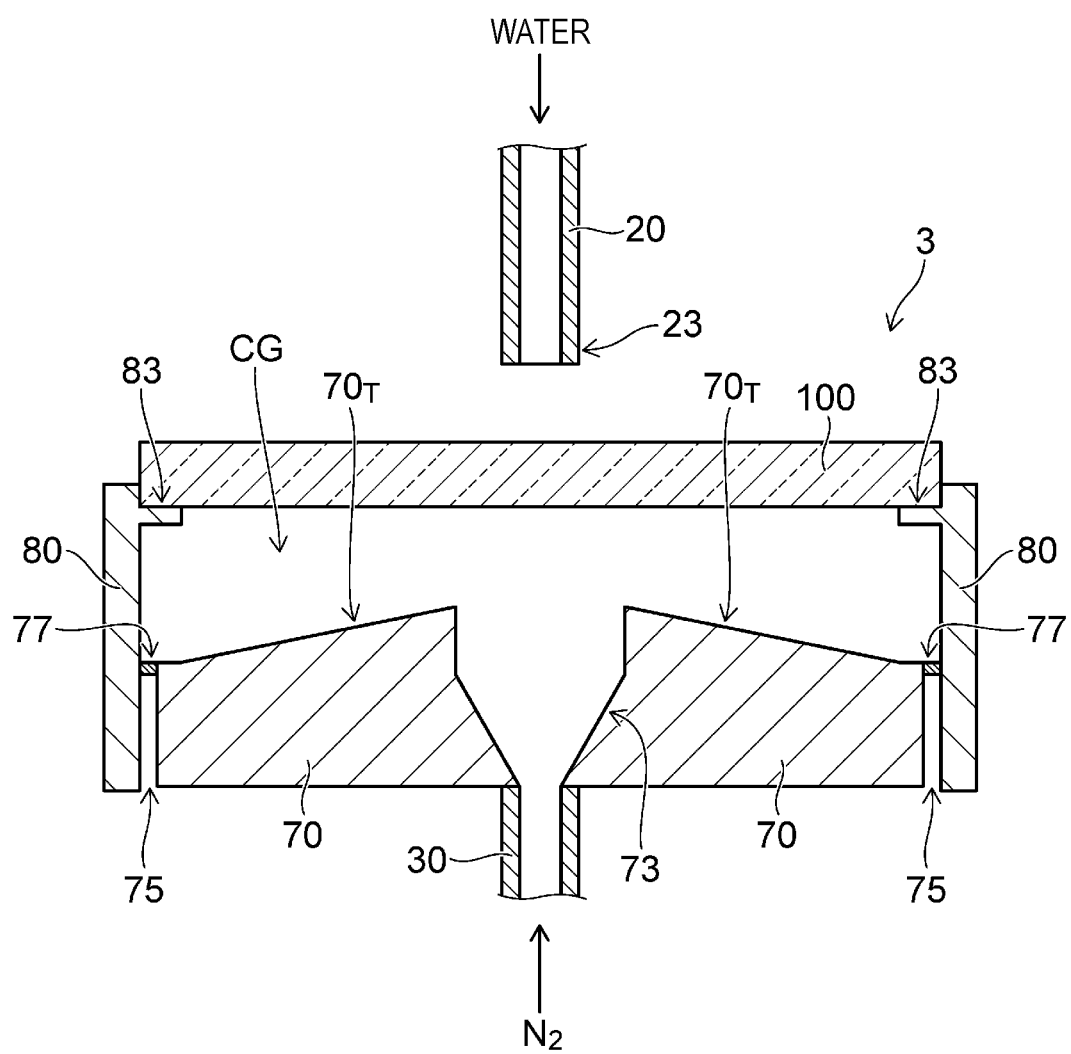
FIG. 4 is a schematic cross-sectional view illustrating a freeze cleaning apparatus according to a second exemplary embodiment.

FIG. 4 is a schematic cross-sectional view illustrating a freeze cleaning apparatus 3 according to a second exemplary embodiment. The freeze cleaning apparatus 3 includes a liquid supply unit 20, a table 70, and a side wall 80.

As illustrated in FIG. 4, the processing target substrate 100 is placed on a substrate holding portion 83 provided on the side wall 80. The substrate holding portion 83 is, for example, a protrusion protruding horizontally from the side wall 80. A cooling space CG is formed between the table 70 and the processing target substrate 100 supported by the substrate holding portion 83. The side wall 80 is provided to surround the cooling space CG. Thus, the cooling space CG becomes a closed space surrounded by the table 70, the side wall 80, and the processing target substrate 100, and the inside of the space may be depressurized.

As illustrated in FIG. 4, the table 70 includes a discharge port 73 that communicates with the cooling gas supply unit 30. In addition, a drain 75 is provided between the table 70 and the side wall 80 to discharge the cooling gas to the outside. Further, a gate valve 77 is provided at the boundary between the drain 75 and the cooling space CG. For example, the cooling space CG may be made as a hermetically sealed space by closing the gate valve 77 and the flow rate adjustment valve 33 (see FIG. 1) of the cooling gas supply unit 30 in a state where the processing target substrate 100 is placed on the substrate holding portion 83, For example, the cooling space CG may be depressurized by connecting a vacuum pump to the drain 75. That is, in the freeze cleaning apparatus 3, for example, low-temperature dry-nitrogen is supplied from the cooling gas supply unit 30 to the cooling space CG via the discharge port 73 and discharged from the cooling space CG via the drain 75. Thus, it is possible to prevent the entry of outside air and to suppress the occurrence of frost in the cooling space CG.

Further, in the freeze cleaning apparatus 3, the interval between the table 70 and the processing target substrate 100 may be made larger than the 99% laminar boundary layer thickness S. Thus, it is possible to increase the flow rate of the cooling gas and to uniformly cool the processing target substrate 100 in a short time.

As illustrated in FIG. 4, the table 70 is provided such that a top surface $70_T$ facing the processing target substrate 100 has a gradient (i.e., sloping surface) descending from the discharge port 73 to the drain 75. For example, even when moisture in the cooling space CG condenses so that water is generated before the start of cooling or at the beginning of cooling, the water is allowed to flow on the top surface $70_T$ of the table 70 toward the drain 75 and is removed from the cooling space.

Figure 5:
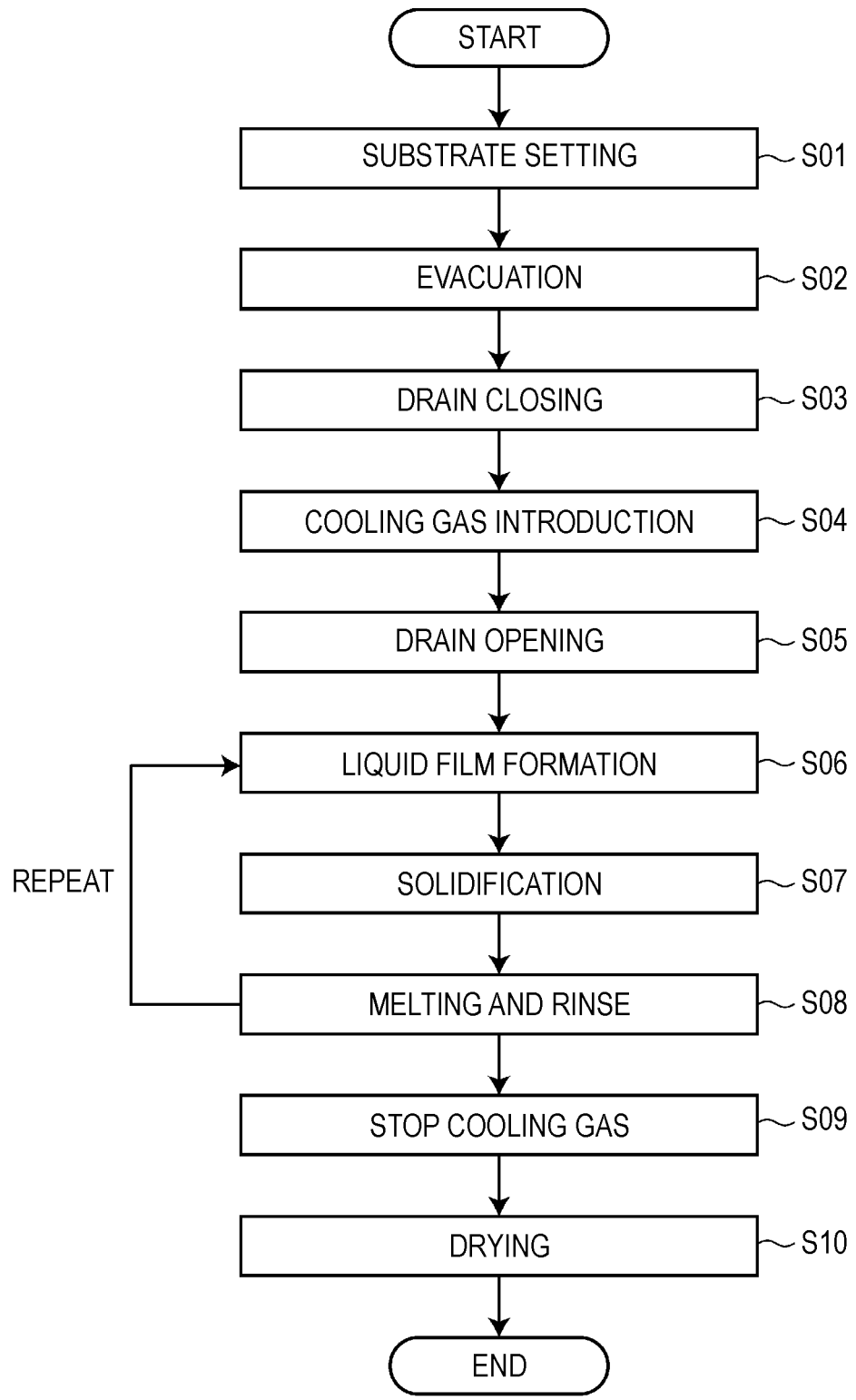
FIG. 5 is a flow chart illustrating an operation of the freeze cleaning apparatus according to the second exemplary embodiment.

Next, the operation procedure of the freeze cleaning apparatus 3 will be described with reference to FIGS. 4 and 5. FIG. 5 is a flow chart illustrating an operation of the freeze cleaning apparatus 3 according to the second exemplary embodiment.

First, the processing target substrate 100 is placed on the substrate holding portion 83 (S01). The processing target substrate 100 has a rear surface facing the table 70 and a top surface opposite thereto. Subsequently, the flow rate adjustment valve 33 of the cooling gas supply unit 30 is closed and the gate valve 77 is opened to reduce the pressure in the cooling space CG (S02). It is assumed that the drain 75 is connected to, for example, a vacuum pump (not illustrated).

When the inside of the cooling space CG reaches a predetermined depressurized state, the gate valve 77 is closed (S03), and the flow rate adjustment valve 33 is opened to introduce the cooling gas (S04). Subsequently, the gate valve 77 is opened to discharge the cooling gas from the cooling space CG via the drain 75 (S05). At this time, the inside of the cooling space CG is maintained at a predetermined pressure by a pressure adjustment valve (not illustrated) disposed between the drain 75 and the vacuum pump.

A cleaning liquid (e.g., deionized water) is dropped from the liquid supply unit 20 onto the top surface of the processing target substrate to form a liquid film (S06). The processing target substrate 100 is cooled by the cooling gas supplied into the cooling space CG, and the liquid film is solidified (S07). For example, the temperature of the liquid film is detected by the temperature sensor 40 (see FIG. 1). Then, when the liquid film is cooled to a predetermined temperature, deionized water is supplied from the liquid supply unit 20 to the top surface of the processing target substrate 100 to melt the solidified liquid film. Subsequently, deionized water is continuously supplied to the top surface of the processing target substrate 100 to perform a rinse (S08). Steps S06 to S08 are repeated a plurality of times.

Subsequently, the cooling gas is stopped (S09), and the processing target substrate 100 is dried (S10). Finally, the pressure inside the cooling space CG is returned to normal pressure, and the processing target substrate is recovered. Thus, the process is terminated.

Third Exemplary Embodiment

Figure 7A:
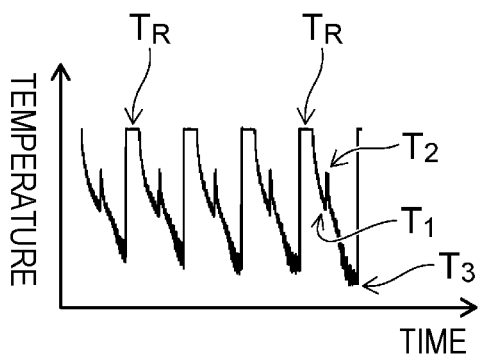
FIGS. 7A to 7C are graphs illustrating characteristics of the freeze cleaning method according to the third exemplary embodiment.
Figure 7B:
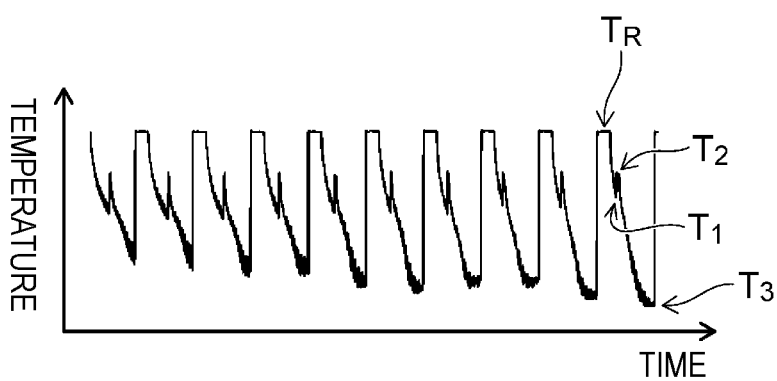
Figure 7C:
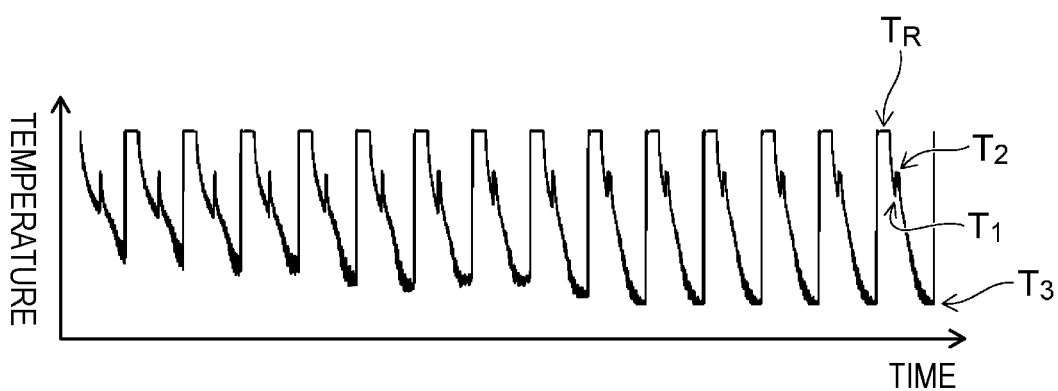

FIG. 6 is a flow chart illustrating a freeze cleaning method according to a third exemplary embodiment. FIGS. 7A to 7C are graphs illustrating characteristics of the freeze cleaning method according to the third exemplary embodiment. The cleaning method according to the exemplary embodiment is performed, for example, by using the freeze cleaning apparatus 1.

As illustrated in FIG. 6, for example, ultraviolet light (UV) is used to hydrophilize the top surface of the processing target substrate 100 (S11: hydrophilization treatment). Subsequently, deionized water is supplied from the nozzle 23 of the liquid supply unit 20 to the top surface of the processing target substrate 100 while the processing target substrate 100 is rotated at a desired rotation speed. Simultaneously, the cooling gas is supplied from the cooling gas supply unit 30 to the cooling space CG via the discharge port 15 of the table 10 (S12: preliminary cooling).

Subsequently, the supply of deionized water from the liquid supply unit 20 is stopped, and the rotation speed is changed such that the liquid film on the processing target substrate 100 is not lost via centrifugal force. Further, the supply of the cooling gas to the cooling space CG is continued to cool the processing target substrate 100. Thus, the liquid film on the processing target substrate 100 is solidified. This cooling is continued for a certain period of time (S13: solidification). Thereafter, deionized water is supplied to the top surface of the processing target substrate 100 to melt the liquid film, and a rinsing process is performed (S14: melting and rinse). Steps S13 and S14 of solidification, melting, and rinsing are carried out repeatedly.

When predetermined conditions are satisfied in the solidification in step S13, the final melting and rinse are carried out (S15), and the processing target substrate 100 is dried (S16: drying). Thus, the freeze cleaning according to the exemplary embodiment is completed.

FIGS. 7A and 7B are graphs illustrating temperature changes of the liquid film detected by the temperature sensor 40 (FIG. 1) in steps S13 and S14. FIG. 7A illustrates a temperature change when the solidification, melting, and rinse are repeated five times. FIG. 7B illustrates a temperature change when the solidification, melting, and rinse are repeated ten times. FIG. 7C illustrates a temperature change when the solidification, melting, and rinse are repeated 15 times.

As illustrated in FIG. 7A, the liquid film is cooled, for example, from room temperature $T_R$ to $T_1$. $T_1$ is a supercooling temperature at which the liquid film is supercooled in the liquid phase state. Subsequently, when solidification of the liquid film is started, the temperature rises from $T_1$ to the freezing point $T_2$. Further, when the cooling is continued, the temperature of the liquid film is lowered from the freezing point $T_2$ to the lowest attainable temperature $T_3$. The cooling time is constant. Thereafter, deionized water is supplied onto the liquid film which is then melted. Subsequently, a liquid film is formed again. The initial temperature is room temperature $T_R$. In the example illustrated in FIG. 7A, this cycle is repeated five times.

In the example illustrated in FIG. 7B, the cycle of $T_R \rightarrow T_1 \rightarrow T_2 \rightarrow T_3 \rightarrow T_R$ is repeated ten times. The temperature change up to the fifth cycle illustrated in FIG. 7B is substantially the same as the temperature change illustrated in FIG. 7A. Compared with FIG. 7A, it can be seen that the supercooling temperature $T_1$ rises in the last cycle. In addition, it can be seen from the temperature change illustrated in FIG. 7B that the supercooling temperature $T_1$ starts to rise from the eighth cycle. Further, it can be seen that the lowest attainable temperature $T_3$ in the last cycle illustrated in FIG. 7B is lower than the lowest attainable temperature $T_3$ in the last cycle illustrated in FIG. 7A.

In the example illustrated in FIG. 7C, the cycle of $T_R \rightarrow T_1 \rightarrow T_2 \rightarrow T_3 \rightarrow T_R$ is repeated 15 times. The temperature change up to the tenth cycle illustrated in FIG. 7C is substantially the same as the temperature change illustrated in FIG. 7B. In FIG. 7C, it can be seen that when the number of cycles exceeds 10, the rise of the supercooling temperature $T_1$ stops and becomes substantially constant. In addition, it can be seen that the lowest attainable temperature $T_3$ also becomes substantially constant when it exceeds 10 cycles.

The temperature changes illustrated in FIGS. 7A to 7C were obtained in the process of processing quartz substrates each having a pattern with a half pitch of 20 nm and a dig depth of 50 nm. Particles having a size of 20 nm were attached to the surface of each substrate before the processing. For example, in the example illustrated in FIG. 7A, 20 particles were observed within the field of view of the microscope, and 19 particles were observed even after the freeze cleaning in the procedure illustrated in FIG. 6. Meanwhile, in the example illustrated in FIG. 7B, the number of particles decreased to 1, and in the example illustrated in FIG. 7C, the number of particles decreased to 2. Looking at temperature changes illustrated in FIGS. 7A and 7B based on the result, it is considered that the changes in the supercooling temperature $T_1$ and the lowest attainable temperature $T_3$ correspond to the change in the number of particles. That is, the rise of the supercooling temperature $T_1$ and the decrease of the lowest attainable temperature $T_3$ correspond to the reduction of the number of parties. Thus, when monitoring these, it is possible to detect the cleanliness of the surface of the processing target substrate 100. For example, it is possible to detect the end point of cleaning, that is, the timing to stop the cycle of solidification, melting, and rinse based on the supercooling temperature $T_1$ and the lowest attainable temperature $T_3$.

For example, in a control unit 50 of the freeze cleaning apparatus 1, the temperature data detected by the temperature sensor 40 is stored in a data storage 53. An arithmetic processor 55 reads the temperature data from the data storage 53 and calculates a change or a change rate in the supercooling temperature $T_1$ or the lowest attainable temperature $T_3$. When the supercooling temperature $T_1$ or the lowest attainable temperature $T_3$ exceeds a predetermined threshold value or falls below the predetermined threshold value on the basis of the output of the arithmetic processor 55, a process controller 57 controls the liquid supply unit 20 and the cooling gas supply unit 30 to stop the cycle of solidification, melting, and rinse.

In addition, the process controller 57 may stop the cycle of solidification, melting, and rinse when the change rate of the supercooling temperature $T_1$ or the lowest attainable temperature $T_3$ becomes smaller than a predetermined value. For example, the process controller 57 is connected to a flow control valve (not illustrated) of the liquid supply unit 20 and configured to control the cleaning liquid supplied from the liquid supply unit 20.

For example, the temperature behavior of the liquid film in the cooling process varies depending on the type of film on the processing target substrate, the presence or absence of a pattern, the difference in cleanliness, and the like. Therefore, when the number of cycles of solidification, melting and rinse is preset, removal performance of fine particles having a size of 20 nm or less may be reduced in some cases. On the other hand, when the cycles of solidification, melting, and rinse are stopped based on changes in the supercooling temperature $T_1$ and the lowest attainable temperature $T_3$, a stable fine particle removing performance may be maintained without depending on the state of the surface of the processing target substrate. For example, the cycles may be stopped based on temperature fluctuation of the liquid film between the cycles of solidification, melting, and rinse.

Furthermore, the cycles may be stopped based on the change of the lowest attainable temperature $T_3$ for each cycle.

Although the first embodiment, the second embodiment, and the third embodiment have been described above, the present disclosure is not limited thereto. For example, the cleaning liquid is not limited to deionized water, but may be an alkaline solution, an organic solvent, an aqueous solution containing a surfactant, or the like. Further, the number of discharge ports of the cooling gas provided in the table is not limited to one, but a plurality of cooling gas discharge ports may be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A freeze cleaning apparatus, comprising:
    a table that faces a first surface of a processing target substrate, the processing target substrate having a second surface opposite the first surface;
    a liquid supply unit configured to supply a cleaning liquid onto the second surface of the processing target substrate placed such that the first surface faces the table;
    a side wall that surrounds a space between the processing target substrate and the table;
    a cooling gas discharge unit that is provided in the table to discharge a cooling gas into the space;
    a drain that discharges the cooling gas from the space to the outside; and
    a valve located on the drain, wherein
    the space between the processing target substrate and the table is a closed space.

2. The freeze cleaning apparatus according to claim 1, wherein a top surface of the table is sloped downward from a center thereof toward the drain.

3. The freeze cleaning apparatus according to claim 1, further comprising:
    a sensor that detects a temperature of the cleaning liquid on the processing target substrate;
    a flow rate adjusting unit that adjusts a flow rate of the cooling gas; and
    a controller that controls the flow rate adjusting unit based on the temperature detected by the sensor.

4. The freeze cleaning apparatus according to claim 3, wherein the controller stops supply of the cooling gas and starts thawing the cleaning liquid based on the temperature detected by the sensor.

* * * * *